US011158784B2

(12) United States Patent
Yoshikawa et al.

(10) Patent No.: US 11,158,784 B2
(45) Date of Patent: Oct. 26, 2021

(54) CRYSTAL MATERIAL AND METHOD OF MANUFACTURING THE SAME

(71) Applicants: PIEZO STUDIO INC., Miyagi (JP); TOHOKU UNIVERSITY, Miyagi (JP)

(72) Inventors: Akira Yoshikawa, Miyagi (JP); Yuui Yokota, Miyagi (JP); Yuji Ohashi, Miyagi (JP); Kei Kamada, Miyagi (JP); Tetsuo Kudo, Miyagi (JP); Kenji Inoue, Miyagi (JP); Yasuhiro Shoji, Miyagi (JP); Yu Igarashi, Miyagi (JP); Mototaka Arakawa, Miyagi (JP); Shunsuke Kurosawa, Miyagi (JP); Akihiro Yamaji, Miyagi (JP)

(73) Assignees: PIEZO STUDIO INC., Miyagi (JP); TOHOKU UNIVERSITY, Miyagi (JP)

( * ) Notice: Subject to any disclaimer, the term of this patent is extended or adjusted under 35 U.S.C. 154(b) by 413 days.

(21) Appl. No.: 16/079,522

(22) PCT Filed: Feb. 24, 2017

(86) PCT No.: PCT/JP2017/007236
§ 371 (c)(1),
(2) Date: Aug. 23, 2018

(87) PCT Pub. No.: WO2017/146244
PCT Pub. Date: Aug. 31, 2017

(65) Prior Publication Data
US 2019/0140160 A1     May 9, 2019

(30) Foreign Application Priority Data

Feb. 25, 2016  (JP) .............................. JP2016-034145

(51) Int. Cl.
| | |
|---|---|
| *H01L 41/187* | (2006.01) |
| *H01L 41/41* | (2013.01) |
| *C30B 29/34* | (2006.01) |
| *C01B 33/24* | (2006.01) |
| *H01L 41/39* | (2013.01) |
| *C30B 11/00* | (2006.01) |
| *C01B 33/26* | (2006.01) |
| *C30B 15/08* | (2006.01) |

(52) U.S. Cl.
CPC .......... *H01L 41/1871* (2013.01); *C01B 33/24* (2013.01); *C01B 33/26* (2013.01); *C30B 11/00* (2013.01); *C30B 15/08* (2013.01); *C30B 29/34* (2013.01); *H01L 41/187* (2013.01); *H01L 41/39* (2013.01); *H01L 41/41* (2013.01); *C01P 2004/02* (2013.01); *C01P 2006/40* (2013.01)

(58) Field of Classification Search
CPC ... H01L 41/187; H01L 41/1871; H01L 41/39; H01L 41/41; C01B 33/24; C01B 33/26; C30B 11/00; C30B 15/08; C30B 9/34
See application file for complete search history.

(56) References Cited

U.S. PATENT DOCUMENTS

2003/0146481 A1* 8/2003 Inoue ................. H03H 9/02543
257/416

FOREIGN PATENT DOCUMENTS

| CN | 104695018 A | * 6/2015 | ............ C30B 15/20 |
|---|---|---|---|
| CN | 104695018 A | 6/2015 | |
| JP | 2002-348197 A | 12/2002 | |
| JP | 2003-246698 A | 9/2003 | |
| JP | 2007-176794 A | 7/2007 | |
| JP | 2008-019122 A | 1/2008 | |
| JP | 2016-047786 A | 4/2016 | |
| WO | 2012/049846 A1 | 4/2012 | |
| WO | 2015/081706 A1 | 6/2015 | |

OTHER PUBLICATIONS

Machine translation of CN-104695018-A, 5 pages. (Year: 2015).*
Cochet-Muchy, "Growth of piezoelectric crystals by Czochralski method", Journal De Physique IV, 14 pages. (Year: 1994).*
Office Action received for Japanese Patent Application No. 2018-501818, dated Dec. 24, 2019, 8 pages (4 pages of English Translation and 4 pages of Office Action).
International Search Report and Written Opinion received for PCT Patent Application No. PCT/JP2017/007236, dated May 23, 2017, 17 pages (9 pages of English Translation and 8 pages of Original Document).
International Preliminary Report on Patentability received for PCT Patent Application No. PCT/JP2017/007236, dated Sep. 7, 2018, 15 pages (9 pages of English Translation and 6 pages of Original Document).
European Search Report and Written Opinion received for EP Patent Application No. 19167373.0, dated Aug. 1, 2019, 6 pages.
Karaki et al., "Growth and high-temperature characterization of langasite-family Ca3NbGa3—xAlxSi2O14 single crystals", Japanese Journal of Applied Physics, vol. 54, 2015, pp. 10ND07-1-10ND07-3.
Kugaenko et al., "High-temperature stability of the phase composition of langasite family crystals", Bulletin of the Russian Academy of Sciences, Physics, vol. 78, No. 10, 2014, pp. 1067-1074.
Medvedev et al., "Investigation of rotated X-cut Ca3TaGa3Si2O14 single crystals operating in FS mode in the temperature range up to 900[deg.]C", 2014 European Frequency and Time Forum (EFTF), IEEE, 2014, pp. 60-62.

(Continued)

*Primary Examiner* — Matthew E. Hoban
*Assistant Examiner* — Lynne Edmondson
(74) *Attorney, Agent, or Firm* — Womble Bond Dickinson (US) LLP

(57) ABSTRACT

The present invention makes clear and defines a congruent composition of a langasite-based oxide, and establishes a method of manufacturing a crystal by any desired composition of $AE_3ME_{1+a}(Ga_{1-x}Al_x)_{3+b}Si_{2+c}O_{14}$ (AE is an alkaline-earth metal, ME is Nb or Ta, $0 \leq x \leq 1$, $-0.5 < a \leq 0$ or $0 < a < 0.5$, $-0.5 < b \leq 0$ or $0 < b \leq 0.5$, and $-0.5 < c \leq 0$ or $0 < c < 0.5$, excluding a=b=c=0). This makes it possible to suppress the formation of an impurity, and improve the yield and crystal manufacturing rate. The raw material is a raw material mixture prepared by mixing an alkaline-earth metal or its carbonate or oxide, Nb or Ta or its oxide, Ga or its oxide, Al or its oxide, and Si or its oxide.

2 Claims, 3 Drawing Sheets

(56) References Cited

OTHER PUBLICATIONS

Supplementary European Search Report and Written Opinion received for EP Patent Application No. 17756678.3, dated Aug. 1, 2019, 9 pages.
Wang et al., "Bridgman growth and characterization of the structure ordered CTGS single crystal", Proceedings of the 2014 Symposium on Piezoelectricity, Acoustic Waves, and Device Applications, IEEE, 2014, pp. 247-250.
Yokota et al., "Growth and piezoelectric properties of $Ca_3Nb(Ga_{1-x}Al_x)_3Si_2O_{14}$ (x=0.25 and 0.50) single crystals", Japanese Journal of Applied Physics, vol. 54, 2015, pp. 10ND13-1-10ND13-4.

\* cited by examiner

CRYSTAL MATERIAL AND METHOD OF MANUFACTURING THE SAME

TECHNICAL FIELD

The present invention relates to a crystal material from which a homogeneous single crystal of a langasite-based oxide having a langasite structure and prospected to be used as a piezoelectric element material in, e.g., an oscillator or combustion pressure sensor is obtained, and a method of manufacturing the same.

BACKGROUND ART

In recent years, a langasite-based oxide that does not contain any rare-earth element but contains an alkaline earth metal has been studied as a material of a piezoelectric element utilized in various devices. This langasite-based oxide has a piezoelectric constant that is greater by several times than that of a rock crystal, a relatively small rate of change in the propagation velocity of surface acoustic liquid with respect to the temperature, and a relatively large electromechanical coupling coefficient. Therefore, the langasite-based oxide is particularly suitable for a material of a piezoelectric element for a piezoelectric device such as the next generation small-sized oscillator or combustion pressure sensor. When applying this langasite-based oxide having the characteristics as described above to a piezoelectric element, the oxide is used as a single crystal having a high piezoelectric constant and aligned crystal orientation.

The above-described langasite-based oxide single crystal is manufactured by using melt growth such as a Czochralski method, a Bridgeman method, a micro-pulling-down method, an EFG (Edge-defined Film-fed Growth) method, and a floating zone method using high frequency induction heating, resistance heating, or infrared focused light heating.

Conventionally, when growing a single crystal by using the abovementioned crystal growth method in the melt growth of the above-described langasite-based oxide single crystal, the starting raw materials of individual elements forming the target langasite-based oxide are mixed at a ratio by which a constant-ratio composition is obtained. In this single crystal growth from the starting raw material having the constant-ratio composition (stoichiometric composition), the constituent element ratio (congruent composition) of a single crystal to be actually grown and the constituent element ratio of the starting raw material are different, so an impurity forms as a portion having a different component in the growing crystal. In the following description, "constant-ratio composition" means "stoichiometric composition". Also, in the Bridgeman method or pulling-up method, the composition of the raw material melt gradually changes during crystal growth, and this melt having the changed composition cannot be used in crystal growth any longer. This decreases a so-called yield, and causes an increase in the manufacturing cost. Especially when manufacturing a langasite-based oxide single crystal by using a starting raw material having a stoichiometric composition, an impurity forms inside the manufactured single crystal at a crystallization ratio of 70% or more in all melt growth methods.

Note that in order to stably grow a langasite-based oxide single crystal not containing any rare-earth element and containing an alkaline-earth metal, a technique which controls the behavior of a raw material melt having a stoichiometric composition by the addition of Au has been proposed (see patent literature 1).

RELATED ART LITERATURE

Patent Literature

Patent Literature 1: International Publication No. 2012/049846

DISCLOSURE OF INVENTION

Problem to be Solved by the Invention

As described above, the conventional methods have the problem in that an impurity is formed as a portion having a different composition in a growing crystal. Also, the conventional methods cause an increase in the manufacturing cost because the composition of a raw material melt gradually changes during crystal growth and this melt having the changed composition cannot be used in crystal growth any longer. Even in the technique of patent literature 1, starting raw materials are mixed at a ratio by which a stoichiometric composition is obtained, so the problem that an impurity forms as a portion having a different composition in a growing crystal similarly exists.

The present invention has been made to solve the problem as described above, and has as its object to manufacture a langasite-based oxide having a desired congruent composition while suppressing the formation of an impurity and preventing the increase in the cost.

Means of Solution to the Problem

A crystal material manufacturing method according to the present invention includes a first step of preparing a raw material mixture by mixing an alkaline-earth metal or its carbonate or oxide, Nb or Ta or its oxide, Ga or its oxide, Al or its oxide, and Si or its oxide, so as to obtain each cation ratio indicated by any desired composition of $AE_3ME_{1+a}(Ga_{1-x}Al_x)_{3+b}Si_{2+c}O_{14}$ (AE is an alkaline-earth metal, ME is Nb or Ta, $0 \leq x \leq 1$, $-0.5 < a \leq 0$ or $0 < a < 0.5$, $-0.5 < b \leq 0$ or $0 < b < 0.5$, and $-0.5 < c \leq 0$ or $0 < c < 0.5$, excluding a=b=c=0), a second step of melting the raw material mixture, and a third step of forming a crystal material made of a langasite-based oxide having the abovementioned desired composition by cooling the melted raw material mixture.

A crystal material according to the present invention includes a langasite-structure oxide having any composition of $AE_3ME_{1+a}(Ga_{1-x}Al_x)_{3+b}Si_{2+c}O_{14}$ (AE is an alkaline-earth metal, ME is Nb or Ta, $0 \leq x \leq 1$, $-0.5 < a \leq 0$ or $0 < a < 0.5$, $-0.5 < b \leq 0$ or $0 < b < 0.5$, and $-0.5 < c \leq 0$ or $0 < c < 0.5$, excluding a=b=c=0). In particular, $-0.1 < a < 0$, $0 < b < 0.05$, and $0 < c < 0.1$.

A crystal material manufacturing method according to the present invention includes a first step of preparing a raw material mixture by mixing an alkaline-earth metal or its carbonate or oxide, Nb or Ta or its oxide, a carbonate or oxide of RE, an oxide of Ga, and Si or its oxide, so as to obtain each cation ratio indicated by any desired composition of $AE_3ME_{1+a}(Ga_{1-x}RE_x)_{3+b}Si_{2+c}O_{14}$ (AE is an alkaline-earth metal, ME is Nb or Ta, RE is at least one of Y, Sc, and lanthanoide, $0 \leq x \leq 1$, $-0.5 < a < 0.5$, $-0.5 < b < 0.5$, and $-0.5 < c < 0.5$), a second step of melting the raw material mixture, and a third step of forming a crystal material made of a langasite-based oxide having the desired composition by cooling the melted raw material mixture.

A crystal material according to the present invention includes a langasite-structure oxide having any composition of $AE_3ME_{1+a}(Ga_{1-x}RE_x)_{3+b}Si_{2+c}O_{14}$ (AE is an alkaline-earth metal, ME is Nb or Ta, RE is at least one of Y, Sc, and lanthanoide, $0 \leq x \leq 1$, $-0.5<a<0.5$, $-0.5<b<0.5$, and $-0.5<c<0.5$).

In the abovementioned crystal material, AE=Ca, ME=Ta, and RE=Sc, and $a \neq 0.0$, $b \neq 0.0$, and $c \neq 0.0$.

In the abovementioned crystal material, $-0.1<a<0$, $0<b<0.05$, and $0<c<0.1$.

Effect of the Invention

As described above, the present invention achieves an excellent effect of manufacturing a langasite-based oxide having a desired congruent composition while suppressing the formation of an impurity and preventing the increase in the cost.

BEST MODE FOR CARRYING OUT THE INVENTION

Figure 1:
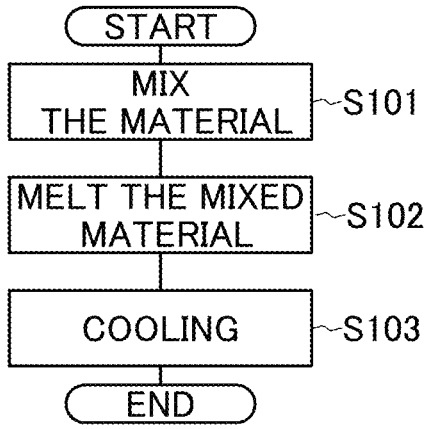
FIG. 1 is a flowchart for explaining a crystal material manufacturing method according to an embodiment of the present invention.

An embodiment of the present invention will be explained below with reference to the accompanying drawings. FIG. 1 is a flowchart for explaining a crystal material manufacturing method according to the embodiment of the present invention. In a first step S101, a raw material mixture is prepared by mixing a carbonate or oxide of an alkaline-earth metal, an oxide of Nb or Ta, an oxide of Ga, an oxide of Al, and an oxide of Si.

In this step, the raw material mixture is prepared by mixing the abovementioned raw materials so as to obtain each cation ratio of any desired composition of $AE_3ME_{1+a}$ $(Ga_{1-x}Al_x)_{3+b}Si_{2+c}O_{14}$ (AE is an alkaline-earth metal, ME is Nb or Ta, $0 \leq x \leq 1$, $-0.5<a \leq 0$ or $0<a<0.5$, $-0.5<b \leq 0$ or $0<b \leq 0.5$, and $-0.5<c<0$ or $0<c<0.5$, excluding $a=b=c=0$). In particular, $-0.1<a<0$, $0<b<0.05$, and $0<c<0.1$ are favorable. The alkaline-earth metal can be Ca, Sr, Ba, or Ra. The above composition is a congruent composition (a congruent melt composition in a phase diagram). Note that the numerical values in the above formula indicate the composition ratios of the individual elements, and indicate the composition ratios of the elements when AE is 3. Note also that the composition ratio of oxygen sometimes shifts from 14 in order to hold the electric charge neutrality of the whole crystal.

In a second step S102, the raw material mixture is melted. In third step S103, a crystal material made of a langasite-based oxide having the abovementioned desired composition is formed by cooling the melted raw material mixture.

The results of actual manufacture will be explained below. In the following explanation, for each of $Ca_3Nb_{1+a}$ $(Ga_{1-x}Al_x)_{3+b}Si_{2+c}O_{14}$ (CNGAS) and $Ca_3Ta_{1+a}$ $(Ga_{1-x}Al_x)_{3+b}Si_{2+c}O_{14}$ (CTGAS), powders of $CaCO_3$, $Nb_2O_5$, $Ta_2O_5$, $\beta\text{-}Ga_2O_3$, $\alpha\text{-}Al_2O_3$, and $SiO_2$ were weighed at a congruent melt composition ratio and mixed so as to obtain each cation ratio. Also, the purity of each raw material powder was 99.99% or greater.

Then, the raw material mixture was calcined at 1,200° C. for a few hours, and filled in a platinum-rhodium alloy crucible. This calcination releases carbon dioxide gas ($CO_2$) from $CaCO_3$, thereby forming calcium oxide. Subsequently, in a high-frequency induction heating micro-pulling-down furnace, a heat-insulating material made of alumina is formed outside and above the platinum-rhodium alloy crucible filled with the calcined raw material mixture, thereby forming a hot zone. In addition, a quartz tube for sealing and a high-frequency work coil for heating are installed outside the heat-insulating material. In this state, the crucible is heated by a high frequency, thereby melting the raw material mixture filled in the crucible by raising the temperature to a melting point or higher (crystal growth).

When the crucible is heated by high-frequency induction heating as described above, the raw material melt flows downward from a $\phi$0.5-mm hole formed in the center of a $\phi$3-mm nozzle positioned in the lower portion of the crucible, and spreads on the bottom surface of the nozzle. A seed crystal installed below the crucible is gradually approached to the raw material melt having spread on the bottom nozzle surface as described above, and the upper portion of the seed crystal is brought into contact with the raw material melt. When 30 minutes had elapsed after the seed crystal and raw material melt are brought into contact with each other, the seed crystal is pulled down at a pulling-down rate of 0.05 mm/min, thereby growing the crystal by unidirectional solidification.

An after heater installed below the crucible has a cylindrical shape, and the nozzle bottom portion, the raw material melt, and each upper interface of the growing crystal are observed with an image capturing camera through one of 3-mm×4-mm observation windows formed in four portions of the after heater.

A single crystal is grown by stable crystal growth until the raw material filled in the crucible is entirely pulled down. Consequently, as shown in photographs of FIGS. 2A and 2B, a crystal bar having a diameter of 3 mm was obtained. For the comparison purposes, a crystal having a constant-ratio composition by which $a=b=c=0$ was manufactured following the same procedures as the above.

Figure 2A:
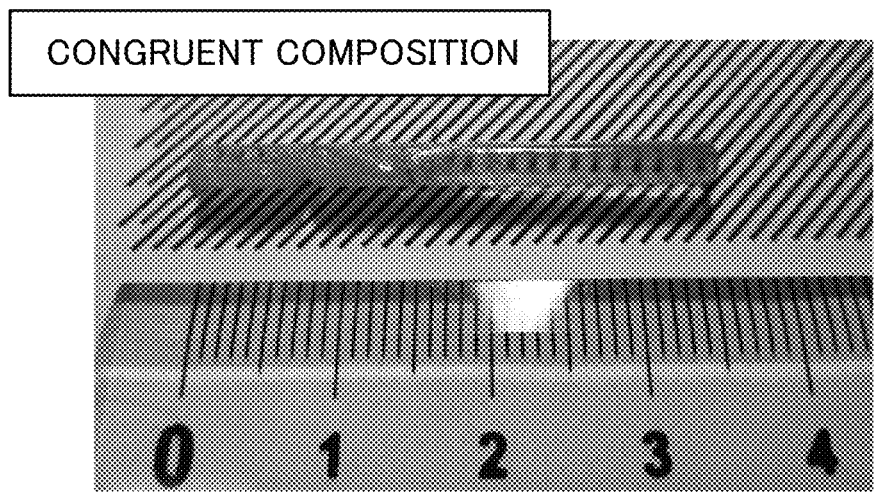
FIG. 2A is a photograph showing the state of a single crystal actually manufactured by using a micro-pulling-down method.
Figure 2B:
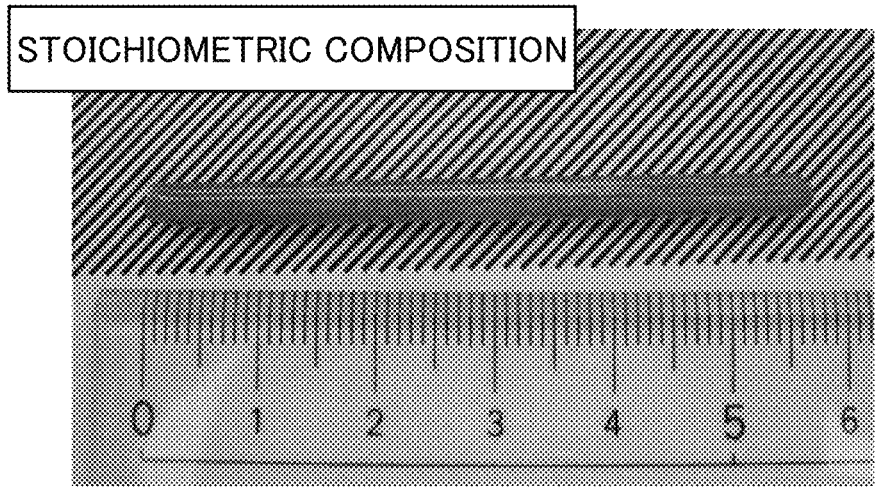
FIG. 2B is a photograph showing the state of a single crystal actually manufactured by using the micro-pulling-down method.

As described above, the crystal having the congruent composition shown in FIG. 2A which was actually manufactured did not have an impurity which forms in a single crystal manufactured from a raw material mixture in which the amount of each raw material is adjusted in the state of a constant-ratio composition, and had a very high transparency. When a portion of the bar was cut at a right angle in the growth direction and the section was observed with a polarizing microscope, no impurity was found inside the single crystal. On the other hand, the actually manufactured constant-ratio-composition crystal [FIG. 2B] had an impurity on the crystal surface, and showed a low transparency. In addition, when a portion of the bar was cut at a right angle in the growth direction and the section was observed with the polarizing microscope, an impurity was found inside the single crystal.

The composition of the manufactured congruent-composition crystal was analyzed by using high-frequency inductively coupled plasma (ICP) atomic emission spectrometry or an electron probe micro analyzer (EPMA). Table 1 below shows the measurement results of some compositions. The composition ratio of the manufactured crystal did not match the stoichiometric composition, but exhibited the congruent melt composition (desired congruent composition) as the starting composition.

TABLE 1

|  | Ca (fixed to 3) | NB | Ga | Si |  |
|---|---|---|---|---|---|
| $Ca_3NbGa_3Si_2O_{14}$ | 3.00 | 1.06 | 3.03 | 1.82 |  |

|  | Ca (fixed to 3) | Ta | Ga | Al | Si |
|---|---|---|---|---|---|
| $Ca_3Ta(Ga_{0.75}Al_{0.25})_3Si_2O_{14}$ | 3.00 | 1.03 | 2.23 | 0.72 | 2.08 |
| $Ca_3Ta(Ga_{0.5}Al_{0.5})_3Si_2O_{14}$ | 3.00 | 1.00 | 1.42 | 1.35 | 2.05 |
| $Ca_3Ta(Ga_{0.25}Al_{0.75})_3Si_2O_{14}$ | 3.00 | 1.00 | 0.74 | 1.97 | 2.05 |

Also, Table 2 below shows all composition analysis results. In Table 2, "+" means that the composition analysis result showed a value greater than the stoichiometric composition, and "−" means that the composition analysis result showed a value that is less than the stoichiometric composition. All compositions exhibited composition analysis results not matching the stoichiometric composition. In addition, when the value of at least one of a, b, and c was greater than 0.5 or less than −0.5 in the composition analysis results, an impurity precipitated, and it was impossible to obtain a high crystal quality. More preferably, it was possible to obtain a crystal with a high yield when the crystal was made of a langasite-structure oxide having any composition of $AE_3ME_{1+a}(Ga_{1-x}Al_x)_{3+b}Si_{2+c}O_{14}$ (AE is an alkaline-earth metal, ME is Nb or Ta, $0 \leq x \leq 1$, $-0.1 < a \leq 0$ or $0 < a < 0.1$, $-0.3 < b \leq 0$ or $0 < b < 0.3$, and $-0.2 < c \leq 0$ or $0 < c < 0.2$, excluding a=b=c=0).

TABLE 2

| Manufactured composition (described by constant-ratio composition) | Chemical composition analysis results | | |
|---|---|---|---|
|  | Ca | Nb | Ga + Al | Si |
| $Ca_3NbGa_3Si_2O_{14}$ | + | + | + |
| $Ca_3NbGa_3Si_2O_{14}$ | − | + | + |
| $Ca_3NbGa_3Si_2O_{14}$ | + | − | + |
| $Ca_3NbGa_3Si_2O_{14}$ | + | + | − |
| $Ca_3NbGa_3Si_2O_{14}$ | − | − | + |
| $Ca_3NbGa_3Si_2O_{14}$ | − | + | − |
| $Ca_3NbGa_3Si_2O_{14}$ | + | − | − |
| $Ca_3NbGa_3Si_2O_{14}$ | − | − | − |
| $Ca_3Nb(Ga_{0.75}Al_{0.25})_3Si_2O_{14}$ | + | + | + |
| $Ca_3Nb(Ga_{0.75}Al_{0.25})_3Si_2O_{14}$ | − | + | + |
| $Ca_3Nb(Ga_{0.75}Al_{0.25})_3Si_2O_{14}$ | + | − | + |
| $Ca_3Nb(Ga_{0.75}Al_{0.25})_3Si_2O_{14}$ | + | + | − |
| $Ca_3Nb(Ga_{0.75}Al_{0.25})_3Si_2O_{14}$ | − | − | + |
| $Ca_3Nb(Ga_{0.75}Al_{0.25})_3Si_2O_{14}$ | − | + | − |
| $Ca_3Nb(Ga_{0.75}Al_{0.25})_3Si_2O_{14}$ | + | − | − |
| $Ca_3Nb(Ga_{0.75}Al_{0.25})_3Si_2O_{14}$ | − | − | − |
| $Ca_3Nb(Ga_{0.5}Al_{0.5})_3Si_2O_{14}$ | + | + | + |
| $Ca_3Nb(Ga_{0.5}Al_{0.5})_3Si_2O_{14}$ | − | + | + |
| $Ca_3Nb(Ga_{0.5}Al_{0.5})_3Si_2O_{14}$ | + | − | + |
| $Ca_3Nb(Ga_{0.5}Al_{0.5})_3Si_2O_{14}$ | + | + | − |
| $Ca_3Nb(Ga_{0.5}Al_{0.5})_3Si_2O_{14}$ | − | − | + |
| $Ca_3Nb(Ga_{0.5}Al_{0.5})_3Si_2O_{14}$ | − | + | − |
| $Ca_3Nb(Ga_{0.5}Al_{0.5})_3Si_2O_{14}$ | + | − | − |
| $Ca_3Nb(Ga_{0.5}Al_{0.5})_3Si_2O_{14}$ | − | − | − |
| $Ca_3Nb(Ga_{0.25}Al_{0.75})_3Si_2O_{14}$ | + | + | + |
| $Ca_3Nb(Ga_{0.25}Al_{0.75})_3Si_2O_{14}$ | − | + | + |
| $Ca_3Nb(Ga_{0.25}Al_{0.75})_3Si_2O_{14}$ | + | − | + |

TABLE 2-continued

| $Ca_3Nb(Ga_{0.25}Al_{0.75})_3Si_2O_{14}$ | + | + | − |
| $Ca_3Nb(Ga_{0.25}Al_{0.75})_3Si_2O_{14}$ | − | − | + |
| $Ca_3Nb(Ga_{0.25}Al_{0.75})_3Si_2O_{14}$ | − | + | − |
| $Ca_3Nb(Ga_{0.25}Al_{0.75})_3Si_2O_{14}$ | + | − | − |
| $Ca_3Nb(Ga_{0.25}Al_{0.75})_3Si_2O_{14}$ | − | − | − |
| $Ca_3NbAl_3Si_2O_{14}$ | + | + | + |
| $Ca_3NbAl_3Si_2O_{14}$ | − | + | + |
| $Ca_3NbAl_3Si_2O_{14}$ | + | − | + |
| $Ca_3NbAl_3Si_2O_{14}$ | + | + | − |
| $Ca_3NbAl_3Si_2O_{14}$ | − | − | + |
| $Ca_3NbAl_3Si_2O_{14}$ | − | + | − |
| $Ca_3NbAl_3Si_2O_{14}$ | + | − | − |
| $Ca_3NbAl_3Si_2O_{14}$ | − | − | − |

| Manufactured composition (described by constant-ratio composition) | Chemical composition analysis results | | |
|---|---|---|---|
|  | Ca | Ta | Ga + Al | Si |
| $Ca_3TaGa_3Si_2O_{14}$ | + | + | + |
| $Ca_3TaGa_3Si_2O_{14}$ | − | + | + |
| $Ca_3TaGa_3Si_2O_{14}$ | + | − | + |
| $Ca_3TaGa_3Si_2O_{14}$ | + | + | − |
| $Ca_3TaGa_3Si_2O_{14}$ | − | − | + |
| $Ca_3TaGa_3Si_2O_{14}$ | − | + | − |
| $Ca_3TaGa_3Si_2O_{14}$ | + | − | − |
| $Ca_3TaGa_3Si_2O_{14}$ | − | − | − |
| $Ca_3Ta(Ga_{0.75}Al_{0.25})_3Si_2O_{14}$ | + | + | + |
| $Ca_3Ta(Ga_{0.75}Al_{0.25})_3Si_2O_{14}$ | − | + | + |
| $Ca_3Ta(Ga_{0.75}Al_{0.25})_3Si_2O_{14}$ | + | − | + |
| $Ca_3Ta(Ga_{0.75}Al_{0.25})_3Si_2O_{14}$ | + | + | − |
| $Ca_3Ta(Ga_{0.75}Al_{0.25})_3Si_2O_{14}$ | − | − | + |
| $Ca_3Ta(Ga_{0.75}Al_{0.25})_3Si_2O_{14}$ | − | + | − |
| $Ca_3Ta(Ga_{0.75}Al_{0.25})_3Si_2O_{14}$ | + | − | − |
| $Ca_3Ta(Ga_{0.75}Al_{0.25})_3Si_2O_{14}$ | − | − | − |
| $Ca_3Ta(Ga_{0.5}Al_{0.5})_3Si_2O_{14}$ | + | + | + |
| $Ca_3Ta(Ga_{0.5}Al_{0.5})_3Si_2O_{14}$ | − | + | + |
| $Ca_3Ta(Ga_{0.5}Al_{0.5})_3Si_2O_{14}$ | + | − | + |
| $Ca_3Ta(Ga_{0.5}Al_{0.5})_3Si_2O_{14}$ | + | + | − |
| $Ca_3Ta(Ga_{0.5}Al_{0.5})_3Si_2O_{14}$ | − | − | + |
| $Ca_3Ta(Ga_{0.5}Al_{0.5})_3Si_2O_{14}$ | − | + | − |
| $Ca_3Ta(Ga_{0.5}Al_{0.5})_3Si_2O_{14}$ | + | − | − |
| $Ca_3Ta(Ga_{0.5}Al_{0.5})_3Si_2O_{14}$ | − | − | − |
| $Ca_3Ta(Ga_{0.25}Al_{0.75})_3Si_2O_{14}$ | + | + | + |
| $Ca_3Ta(Ga_{0.25}Al_{0.75})_3Si_2O_{14}$ | − | + | + |
| $Ca_3Ta(Ga_{0.25}Al_{0.75})_3Si_2O_{14}$ | + | − | + |
| $Ca_3Ta(Ga_{0.25}Al_{0.75})_3Si_2O_{14}$ | + | + | − |
| $Ca_3Ta(Ga_{0.25}Al_{0.75})_3Si_2O_{14}$ | − | − | + |
| $Ca_3Ta(Ga_{0.25}Al_{0.75})_3Si_2O_{14}$ | − | + | − |
| $Ca_3Ta(Ga_{0.25}Al_{0.75})_3Si_2O_{14}$ | + | − | − |
| $Ca_3Ta(Ga_{0.25}Al_{0.75})_3Si_2O_{14}$ | − | − | − |
| $Ca_3TaAl_3Si_2O_{14}$ | + | + | + |
| $Ca_3TaAl_3Si_2O_{14}$ | − | + | + |
| $Ca_3TaAl_3Si_2O_{14}$ | + | − | + |
| $Ca_3TaAl_3Si_2O_{14}$ | + | + | − |
| $Ca_3TaAl_3Si_2O_{14}$ | − | − | + |
| $Ca_3TaAl_3Si_2O_{14}$ | − | + | − |
| $Ca_3TaAl_3Si_2O_{14}$ | + | − | − |
| $Ca_3TaAl_3Si_2O_{14}$ | − | − | − |

Figure 3:
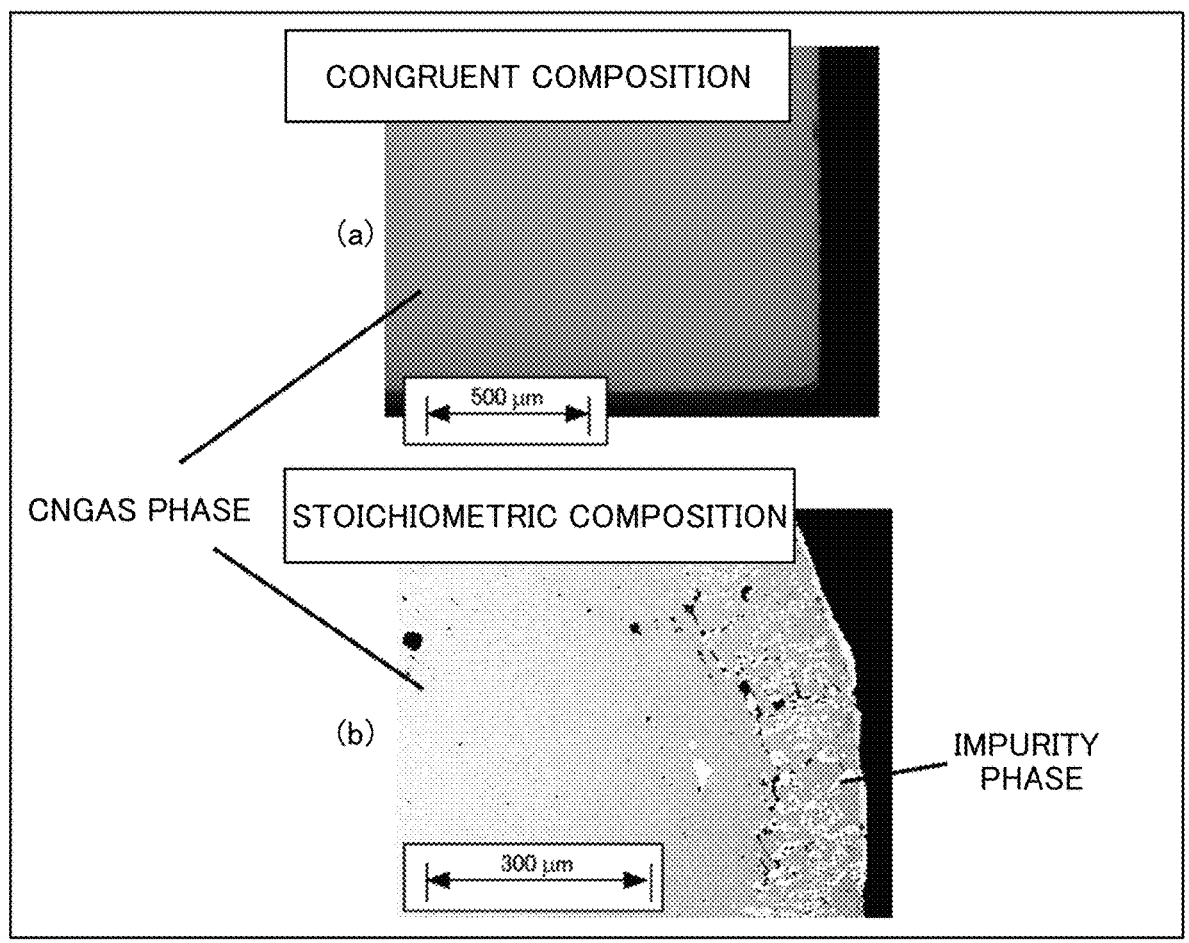
FIG. 3 is a photograph showing a backscattered electron image of an actually manufactured single crystal (CNGS)

+: Greater than stoichiometric composition
−: Less than stoichiometric composition FIG. 3 shows the result of observation performed on the manufactured crystal (CNGAS) by using a backscattered electron image obtained by a scanning electron microscope. As indicated by (a) in FIG. 3, no crystal structure other than the CNGAS crystal having the desired congruent composition was found on the crystal section of the congruent composition. On the other hand, as indicated by (b) in FIG. 3, a composition other than the CNGAS crystal was found on the crystal section of the constant-ratio composition.

Next, another embodiment of the present invention will be explained. In the other embodiment, in the first step described above, a raw material mixture is prepared by mixing an alkaline-earth metal or its carbonate or oxide, Nb or Ta or its oxide, a carbonate or oxide of RE, an oxide of Ga, and Si or its oxide, so as to obtain each cation ratio indicated by any desired composition of $AE_3ME_{1+a}(Ga_{1-x}RE_x)_{3+b}Si_{2+c}O_{14}$ (AE is an alkaline-earth metal, ME is Nb or Ta, RE is at least one of Y, Sc, and lanthanoide, $0 \leq x \leq 1$, $-0.5 < a < 0.5$, $-0.5 < b < 0.5$, and $-0.5 < c < 0.5$). RE is a so-called rare-earth element. Note that $-0.1 < a < 0$, $0 < b < 0.05$, and $0 < c < 0.1$ are more favorable.

Note that $a \neq 0.0$, $b \neq 0.0$, and $c \neq 0.0$ are used when AE=Ca, ME=Ta, and RE=Sc.

After the raw material mixture was prepared as described above, the raw material mixture is melted in the second step, and the melted raw material mixture is cooled in the third step, thereby forming a crystal material made of a langasite-based oxide having the abovementioned desired composition, in the same manner as in the above-described embodiment.

Next, the actually manufactured $Ca_3Ta_{0.98}(Ga_{0.9}Sc_{0.1})_{3.03}Si_{2.07}O_{14.1}$ (CTGSS) having the congruent composition will be explained below. This is an example in which AE was Ca, ME was Ta, and RE was Sc. In the manufacture of this crystal material, powders of $CaCO_3$, $Ta_2O_5$, $\beta$-$Ga_2O_3$, $Sc_2O_3$, and $SiO_2$ were weighed by the congruent melt composition ratio and mixed so as to obtain each cation ratio indicated in the above formula. The purity of each raw material powder was 99.99% or greater. A crystal bar having a diameter of 3 mm was obtained by growing the crystal in the same manner as in the above-described embodiment. For the comparison purposes, a crystal having a constant-ratio composition in which $a=b=c=0$ was also manufactured in the same manner as the above.

The composition of the manufactured congruent-composition crystal (CTGSS) was analyzed by using high-frequency inductively coupled plasma (ICP) atomic emission spectrometry or an electron probe micro analyzer (EPMA). Table 3 below shows the measurement results of some compositions. The composition ratio of the manufactured crystal did not match the stoichiometric composition, but exhibited the congruent melt composition (desired congruent composition) as the starting composition.

Also, Table 4 below shows all composition analysis results. Symbols in this table are the same as those of the above-described embodiment. All compositions exhibited composition analysis results not matching the stoichiometric composition. In addition, when the value of at least one of a, b, and c was greater than 0.5 or less than −0.5 in the composition analysis results, an impurity precipitated, and it was impossible to obtain a high crystal quality.

TABLE 3

| | Ca (fixed to 3) | Ta | Ga | Sc | Si |
|---|---|---|---|---|---|
| $Ca_3Ta(Ga_{0.75}Sc_{0.25})_3Si_2O_{14}$ | 3.00 | 0.98 | 2.27 | 0.76 | 2.07 |
| $Ca_3Ta(Ga_{0.5}Sc_{0.5})_3Si_2O_{14}$ | 3.00 | 0.97 | 1.53 | 1.51 | 2.08 |
| $Ca_3Ta(Ga_{0.25}Sc_{0.75})_3Si_2O_{14}$ | 3.00 | 0.97 | 0.78 | 2.28 | 2.09 |

TABLE 4

| | Ca (fixed to 3) | Ta | Ga + RE | Si |
|---|---|---|---|---|
| $Ca_3Ta(Ga_{0.75}Y_{0.25})_3Si_2O_{14}$ | | − | + | + |
| $Ca_3Ta(Ga_{0.5}Y_{0.5})_3Si_2O_{14}$ | | − | + | + |
| $Ca_3Ta(Ga_{0.25}Y_{0.75})_3Si_2O_{14}$ | | − | + | + |
| $Ca_3Ta(Ga_{0.75}La_{0.25})_3Si_2O_{14}$ | | + | − | + |
| $Ca_3Ta(Ga_{0.5}La_{0.5})_3Si_2O_{14}$ | | + | + | − |
| $Ca_3Ta(Ga_{0.25}La_{0.75})_3Si_2O_{14}$ | | + | − | − |
| $Ca_3Ta(Ga_{0.75}Ce_{0.25})_3Si_2O_{14}$ | | + | − | + |
| $Ca_3Ta(Ga_{0.5}Ce_{0.5})_3Si_2O_{14}$ | | + | + | − |
| $Ca_3Ta(Ga_{0.5}Ce_{0.75})_3Si_2O_{14}$ | | + | − | − |
| $Ca_3Ta(Ga_{0.75}Nd_{0.25})_3Si_2O_{14}$ | | + | − | + |
| $Ca_3Ta(Ga_{0.5}Nd_{0.5})_3Si_2O_{14}$ | | + | + | − |
| $Ca_3Ta(Ga_{0.25}Nd_{0.75})_3Si_2O_{14}$ | | + | − | − |
| $Ca_3Ta(Ga_{0.75}Sm_{0.25})_3Si_2O_{14}$ | | − | + | + |
| $Ca_3Ta(Ga_{0.5}Sm_{0.5})_3Si_2O_{14}$ | | − | + | + |
| $Ca_3Ta(Ga_{0.25}Sm_{0.75})_3Si_2O_{14}$ | | − | + | + |
| $Ca_3Ta(Ga_{0.75}Eu_{0.25})_3Si_2O_{14}$ | | − | + | + |
| $Ca_3Ta(Ga_{0.5}Eu_{0.5})_3Si_2O_{14}$ | | − | + | + |
| $Ca_3Ta(Ga_{0.25}Eu_{0.75})_3Si_2O_{14}$ | | − | + | + |
| $Ca_3Ta(Ga_{0.75}Gd_{0.25})_3Si_2O_{14}$ | | − | + | + |
| $Ca_3Ta(Ga_{0.5}Gd_{0.5})_3Si_2O_{14}$ | | − | + | + |
| $Ca_3Ta(Ga_{0.25}Gd_{0.75})_3Si_2O_{14}$ | | − | + | + |
| $Ca_3Ta(Ga_{0.75}Tb_{0.25})_3Si_2O_{14}$ | | − | + | + |
| $Ca_3Ta(Ga_{0.5}Tb_{0.5})_3Si_2O_{14}$ | | − | + | + |
| $Ca_3Ta(Ga_{0.25}Tb_{0.75})_3Si_2O_{14}$ | | − | + | + |
| $Ca_3Ta(Ga_{0.75}Dy_{0.25})_3Si_2O_{14}$ | | − | + | + |
| $Ca_3Ta(Ga_{0.5}Dy_{0.5})_3Si_2O_{14}$ | | − | + | + |
| $Ca_3Ta(Ga_{0.25}Dy_{0.75})_3Si_2O_{14}$ | | − | + | + |
| $Ca_3Ta(Ga_{0.75}Ho_{0.25})_3Si_2O_{14}$ | | − | + | + |
| $Ca_3Ta(Ga_{0.5}Ho_{0.5})_3Si_2O_{14}$ | | − | + | + |
| $Ca_3Ta(Ga_{0.25}Ho_{0.75})_3Si_2O_{14}$ | | − | + | + |
| $Ca_3Ta(Ga_{0.75}Er_{0.25})_3Si_2O_{14}$ | | − | + | + |
| $Ca_3Ta(Ga_{0.5}Er_{0.5})_3Si_2O_{14}$ | | − | + | + |
| $Ca_3Ta(Ga_{0.25}Er_{0.75})_3Si_2O_{14}$ | | − | + | + |
| $Ca_3Ta(Ga_{0.75}Tm_{0.25})_3Si_2O_{14}$ | | − | + | + |
| $Ca_3Ta(Ga_{0.5}Tm_{0.5})_3Si_2O_{14}$ | | − | + | + |
| $Ca_3Ta(Ga_{0.25}Tm_{0.75})_3Si_2O_{14}$ | | − | + | + |
| $Ca_3Ta(Ga_{0.75}Yb_{0.25})_3Si_2O_{14}$ | | − | + | + |
| $Ca_3Ta(Ga_{0.5}Yb_{0.5})_3Si_2O_{14}$ | | − | + | + |
| $Ca_3Ta(Ga_{0.25}Yb_{0.75})_3Si_2O_{14}$ | | − | + | + |
| $Ca_3Ta(Ga_{0.75}Lu_{0.25})_3Si_2O_{14}$ | | − | + | + |
| $Ca_3Ta(Ga_{0.5}Lu_{0.5})_3Si_2O_{14}$ | | − | + | + |
| $Ca_3Ta(Ga_{0.25}Lu_{0.75})_3Si_2O_{14}$ | | − | + | + |

Table 5 below shows the results (composition analysis results) when a crystal was manufactured following the same procedures as the above by using ME as Nb.

TABLE 5

| | Ca (fixed to 3) | Nb | Ga + RE | Si |
|---|---|---|---|---|
| $Ca_3Nb(Ga_{0.75}Y_{0.25})_3Si_2O_{14}$ | | − | + | + |
| $Ca_3Nb(Ga_{0.5}Y_{0.5})_3Si_2O_{14}$ | | − | + | + |
| $Ca_3Nb(Ga_{0.25}Y_{0.75})_3Si_2O_{14}$ | | − | + | + |
| $Ca_3Nb(Ga_{0.75}La_{0.25})_3Si_2O_{14}$ | | + | − | + |
| $Ca_3Nb(Ga_{0.5}La_{0.5})_3Si_2O_{14}$ | | + | + | − |
| $Ca_3Nb(Ga_{0.25}La_{0.75})_3Si_2O_{14}$ | | + | − | − |
| $Ca_3Nb(Ga_{0.75}Ce_{0.25})_3Si_2O_{14}$ | | + | − | + |
| $Ca_3Nb(Ga_{0.5}Ce_{0.5})_3Si_2O_{14}$ | | + | + | − |
| $Ca_3Nb(Ga_{0.25}Ce_{0.75})_3Si_2O_{14}$ | | + | − | − |
| $Ca_3Nb(Ga_{0.75}Nd_{0.25})_3Si_2O_{14}$ | | + | − | + |
| $Ca_3Nb(Ga_{0.5}Nd_{0.5})_3Si_2O_{14}$ | | + | + | − |
| $Ca_3Nb(Ga_{0.25}Nd_{0.75})_3Si_2O_{14}$ | | + | − | − |
| $Ca_3Nb(Ga_{0.75}Sm_{0.25})_3Si_2O_{14}$ | | − | + | + |
| $Ca_3Nb(Ga_{0.5}Sm_{0.5})_3Si_2O_{14}$ | | − | + | + |
| $Ca_3Nb(Ga_{0.25}Sm_{0.75})_3Si_2O_{14}$ | | − | + | + |
| $Ca_3Nb(Ga_{0.75}Eu_{0.25})_3Si_2O_{14}$ | | − | + | + |
| $Ca_3Nb(Ga_{0.5}Eu_{0.5})_3Si_2O_{14}$ | | − | + | + |
| $Ca_3Nb(Ga_{0.25}Eu_{0.75})_3Si_2O_{14}$ | | − | + | + |
| $Ca_3Nb(Ga_{0.75}Gd_{0.25})_3Si_2O_{14}$ | | − | + | + |
| $Ca_3Nb(Ga_{0.5}Gd_{0.5})_3Si_2O_{14}$ | | − | + | + |
| $Ca_3Nb(Ga_{0.25}Gd_{0.75})_3Si_2O_{14}$ | | − | + | + |
| $Ca_3Nb(Ga_{0.75}Tb_{0.25})_3Si_2O_{14}$ | | − | + | + |
| $Ca_3Nb(Ga_{0.5}Tb_{0.5})_3Si_2O_{14}$ | | − | + | + |
| $Ca_3Nb(Ga_{0.25}Tb_{0.75})_3Si_2O_{14}$ | | − | + | + |
| $Ca_3Nb(Ga_{0.75}Dy_{0.25})_3Si_2O_{14}$ | | − | + | + |
| $Ca_3Nb(Ga_{0.5}Dy_{0.5})_3Si_2O_{14}$ | | − | + | + |
| $Ca_3Nb(Ga_{0.25}Dy_{0.75})_3Si_2O_{14}$ | | − | + | + |
| $Ca_3Nb(Ga_{0.75}Ho_{0.25})_3Si_2O_{14}$ | | − | + | + |
| $Ca_3Nb(Ga_{0.5}Ho_{0.5})_3Si_2O_{14}$ | | − | + | + |
| $Ca_3Nb(Ga_{0.25}Ho_{0.75})_3Si_2O_{14}$ | | − | + | + |

TABLE 5-continued

| | Ca (fixed to 3) | Nb | Ga + RE | Si |
|---|---|---|---|---|
| $Ca_3Nb(Ga_{0.75}Er_{0.25})_3Si_2O_{14}$ | | − | + | + |
| $Ca_3Nb(Ga_{0.5}Er_{0.5})_3Si_2O_{14}$ | | − | + | + |
| $Ca_3Nb(Ga_{0.25}Er_{0.75})_3Si_2O_{14}$ | | − | + | + |
| $Ca_3Nb(Ga_{0.75}Tm_{0.25})_3Si_2O_{14}$ | | − | + | + |
| $Ca_3Nb(Ga_{0.5}Tm_{0.5})_3Si_2O_{14}$ | | − | + | + |
| $Ca_3Nb(Ga_{0.25}Tm_{0.75})_3Si_2O_{14}$ | | − | + | + |
| $Ca_3Nb(Ga_{0.75}Yb_{0.25})_3Si_2O_{14}$ | | − | + | + |
| $Ca_3Nb(Ga_{0.5}Yb_{0.5})_3Si_2O_{14}$ | | − | + | + |
| $Ca_3Nb(Ga_{0.25}Yb_{0.75})_3Si_2O_{14}$ | | − | + | + |
| $Ca_3Nb(Ga_{0.75}Lu_{0.25})_3Si_2O_{14}$ | | − | + | + |
| $Ca_3Nb(Ga_{0.5}Lu_{0.5})_3Si_2O_{14}$ | | − | + | + |
| $Ca_3Nb(Ga_{0.25}Lu_{0.75})_3Si_2O_{14}$ | | − | + | + |

Figure 4:
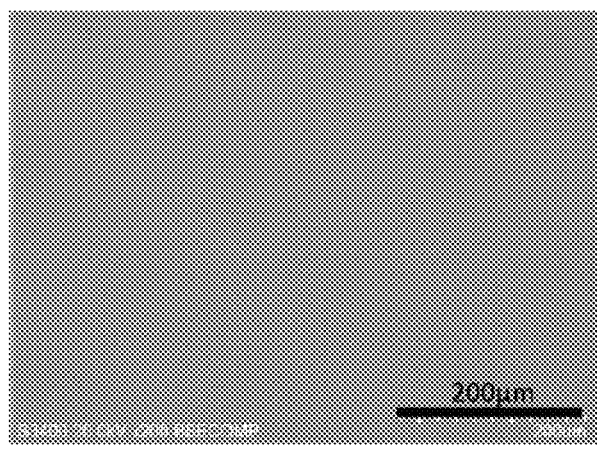
FIG. 4A is a photograph showing a backscattered electron image of an actually manufactured CTGSS.
FIG. 4B is a photograph showing a backscattered electron image of an actually manufactured CTGSS.
FIG. 4C is a photograph showing a backscattered electron image of an actually manufactured CTGSS.
Figure 4:
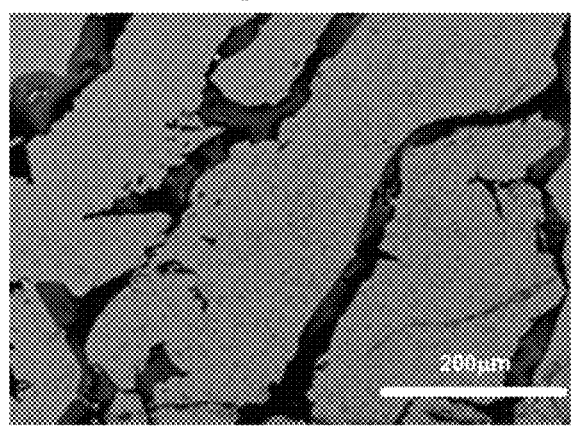
Figure 4:
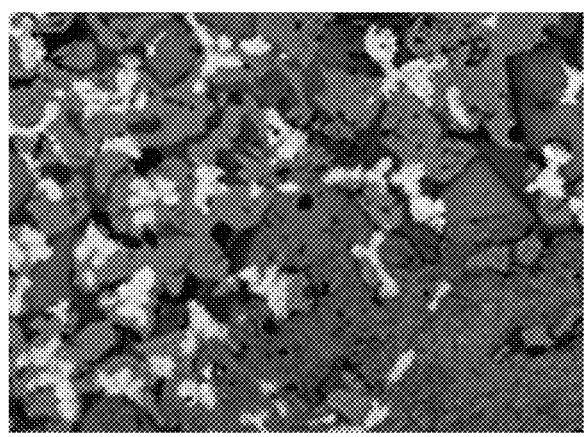

FIGS. 4A, 4B, and 4C show the results of observation performed on the manufactured crystal $Ca_3Ta_{0.98}(Ga_{0.9}Sc_{0.1})_{3.03}Si_{2.07}O_{14.1}$ (CTGSS) by using a backscattered electron image obtained by a scanning electron microscope. As shown in FIG. 4A, no crystal structure other than the CTGSS crystal having the desired congruent composition was found on the crystal section of the congruent composition. On the other hand, as shown in FIG. 4B, a composition other than the CTGSS crystal was found on the crystal section of the constant-ratio composition. Furthermore, a composition other than the CTGSS crystal was found when a starting composition in which the value of at least one of a, b, and c of greater than 0.5 was selected (FIG. 4C).

In the present invention as has been explained above, a raw material mixture is prepared by mixing an alkaline-earth metal or its carbonate or oxide, Nb or Ta or its oxide, Ga or its oxide, Al or its oxide, and Si or its oxide, so as to obtain each cation ratio of a langasite-based oxide having a desired congruent composition. This makes it possible to manufacture the langasite-based oxide having the desired congruent composition while suppressing the formation of an impurity and preventing the increase in the cost. The present invention can improve the yield and crystal manufacturing rate.

Also, in the present invention, a raw material mixture is prepared by mixing an alkaline-earth metal or its carbonate or oxide, Nb or Ta or its oxide, Ga or its oxide, a rare-earth element or its carbonate or oxide, and Si or its oxide, so as to obtain each cation ratio of a langasite-based oxide having a desired congruent composition. This makes it possible to manufacture the langasite-based oxide having the desired congruent composition while suppressing the formation of an impurity and the increase in the cost. The present invention can improve the yield and crystal manufacturing rate.

The langasite-based oxide obtained as described above contains no impurity inside the crystal and hence has a high quality. In addition, the langasite-based oxide having a congruent composition has a sound velocity distribution more uniform than that of a langasite-based oxide having a constant-ratio composition. Therefore, when applying the present invention to an element for a piezoelectric device such as an oscillator and a combustion pressure sensor, an improvement of the stability of the piezoelectric characteristics can be obtained.

Tables 6 and 7 below show the crystallization ratio of each component of $Ca_3ME_{1+a}(Ga_{1-x}Al_x)_{3+b}Si_{2+c}O_{14}$ and the crystallization ratio of each component of $AE_3ME_{1+a}(Ga_{1-x}RE_x)_{3+b}Si_{2+c}O_{14}$. The crystallization ratio is a value obtained by dividing the mass of the manufactured crystal by the mass of the melt filled in the crucible. As shown in Tables 6 and 7, higher crystallization ratios were obtained when $-0.1<a<0$, $0<b<0.05$, and $0<c<0.1$. The higher the crystallization ratio, the higher the productivity becomes.

TABLE 6

| Composition | Crystallization Ratio |
|---|---|
| $Ca_3Ta_{0.98}(Ga_{0.75}Al_{0.25})_{3.02}Si_{2.07}O_{14}$ | 60% |
| $Ca_3Ta_{0.88}(Ga_{0.75}Al_{0.25})_{3.16}Si_{2.21}O_{14}$ | 41% |
| $Ca_3Ta_{0.98}(Ga_{0.5}Al_{0.5})_{3.02}Si_{2.07}O_{14}$ | 62% |
| $Ca_3Ta_{0.88}(Ga_{0.5}Al_{0.5})_{3.17}Si_{2.22}O_{14}$ | 40% |
| $Ca_3Ta_{0.98}(Ga_{0.25}Al_{0.75})_{3.02}Si_{2.07}O_{14}$ | 61% |
| $Ca_3Ta_{0.89}(Ga_{0.25}Al_{0.75})_{3.17}Si_{2.23}O_{14}$ | 43% |
| $Ca_3Nb_{0.98}(Ga_{0.75}Al_{0.25})_{3.02}Si_{2.07}O_{14}$ | 63% |
| $Ca_3Nb_{0.88}(Ga_{0.75}Al_{0.25})_{3.18}Si_{2.22}O_{14}$ | 40% |
| $Ca_3Nb_{0.98}(Ga_{0.5}Al_{0.5})_{3.02}Si_{2.07}O_{14}$ | 61% |
| $Ca_3Nb_{0.87}(Ga_{0.5}Al_{0.5})_{3.18}Si_{2.23}O_{14}$ | 41% |
| $Ca_3Nb_{0.98}(Ga_{0.25}Al_{0.75})_{3.02}Si_{2.07}O_{14}$ | 62% |
| $Ca_3Nb_{0.88}(Ga_{0.25}Al_{0.75})_{3.16}Si_{2.21}O_{14}$ | 40% |
| $Ca_3Ta_{0.98}(Ga_{0.75}Sc_{0.25})_{3.02}Si_{2.07}O_{14}$ | 60% |
| $Ca_3Ta_{0.87}(Ga_{0.75}Sc_{0.25})_{3.17}Si_{2.24}O_{14}$ | 43% |
| $Ca_3Ta_{0.98}(Ga_{0.5}Sc_{0.5})_{3.02}Si_{2.07}O_{14}$ | 62% |
| $Ca_3Ta_{0.88}(Ga_{0.5}Sc_{0.5})_{3.16}Si_{2.24}O_{14}$ | 40% |
| $Ca_3Ta_{0.98}(Ga_{0.25}Sc_{0.75})_{3.02}Si_{2.07}O_{14}$ | 61% |
| $Ca_3Ta_{0.88}(Ga_{0.25}Sc_{0.75})_{3.16}Si_{2.22}O_{14}$ | 41% |
| $Ca_3Nb_{0.98}(Ga_{0.75}Sc_{0.25})_{3.02}Si_{2.07}O_{14}$ | 63% |
| $Ca_3Nb_{0.87}(Ga_{0.75}Sc_{0.25})_{3.18}Si_{2.24}O_{14}$ | 44% |
| $Ca_3Nb_{0.98}(Ga_{0.5}Sc_{0.5})_{3.02}Si_{2.07}O_{14}$ | 61% |
| $Ca_3Nb_{0.88}(Ga_{0.5}Sc_{0.5})_{3.16}Si_{2.21}O_{14}$ | 40% |
| $Ca_3Nb_{0.98}(Ga_{0.25}Sc_{0.75})_{3.02}Si_{2.07}O_{14}$ | 62% |
| $Ca_3Nb_{0.98}(Ga_{0.25}Sc_{0.75})_{3.17}Si_{2.23}O_{14}$ | 42% |

TABLE 7

| Composition | Crystallization Ratio |
|---|---|
| $Ca_3Ta_{0.98}(Ga_{0.75}Lu_{0.25})_{3.02}Si_{2.07}O_{14}$ | 61% |
| $Ca_3Ta_{0.87}(Ga_{0.75}Lu_{0.25})_{3.17}Si_{2.24}O_{14}$ | 42% |
| $Ca_3Ta_{0.98}(Ga_{0.5}Lu_{0.5})_{3.02}Si_{2.07}O_{14}$ | 63% |
| $Ca_3Ta_{0.88}(Ga_{0.5}Lu_{0.5})_{3.16}Si_{2.24}O_{14}$ | 40% |
| $Ca_3Ta_{0.98}(Ga_{0.25}Lu_{0.75})_{3.02}Si_{2.07}O_{14}$ | 62% |
| $Ca_3Ta_{0.88}(Ga_{0.25}Lu_{0.75})_{3.16}Si_{2.22}O_{14}$ | 41% |
| $Ca_3Nb_{0.98}(Ga_{0.75}Lu_{0.25})_{3.02}Si_{2.07}O_{14}$ | 62% |
| $Ca_3Nb_{0.87}(Ga_{0.75}Lu_{0.25})_{3.18}Si_{2.24}O_{14}$ | 43% |
| $Ca_3Nb_{0.98}(Ga_{0.5}Lu_{0.5})_{3.02}Si_{2.07}O_{14}$ | 61% |
| $Ca_3Nb_{0.88}(Ga_{0.5}Lu_{0.5})_{3.16}Si_{2.21}O_{14}$ | 41% |
| $Ca_3Nb_{0.98}(Ga_{0.25}Lu_{0.75})_{3.02}Si_{2.07}O_{14}$ | 61% |
| $Ca_3Nb_{0.88}(Ga_{0.25}Lu_{0.75})_{3.17}Si_{2.23}O_{14}$ | 43% |
| $Ca_3Ta_{0.98}(Ga_{0.75}Gd_{0.25})_{3.02}Si_{2.07}O_{14}$ | 60% |
| $Ca_3Ta_{0.87}(Ga_{0.75}Gd_{0.25})_{3.17}Si_{2.24}O_{14}$ | 42% |
| $Ca_3Ta_{0.98}(Ga_{0.5}Gd_{0.5})_{3.02}Si_{2.07}O_{14}$ | 62% |
| $Ca_3Ta_{0.88}(Ga_{0.5}Gd_{0.5})_{3.16}Si_{2.24}O_{14}$ | 40% |
| $Ca_3Ta_{0.98}(Ga_{0.25}Gd_{0.75})_{3.02}Si_{2.07}O_{14}$ | 60% |
| $Ca_3Ta_{0.88}(Ga_{0.25}Gd_{0.75})_{3.16}Si_{2.22}O_{14}$ | 43% |
| $Ca_3Nb_{0.98}(Ga_{0.75}Gd_{0.25})_{3.02}Si_{2.07}O_{14}$ | 61% |
| $Ca_3Nb_{0.87}(Ga_{0.75}Gd_{0.25})_{3.18}Si_{2.24}O_{14}$ | 42% |
| $Ca_3Nb_{0.98}(Ga_{0.5}Gd_{0.5})_{3.02}Si_{2.07}O_{14}$ | 61% |
| $Ca_3Nb_{0.88}(Ga_{0.5}Gd_{0.5})_{3.16}Si_{2.21}O_{14}$ | 40% |
| $Ca_3Nb_{0.98}(Ga_{0.25}Gd_{0.75})_{3.02}Si_{2.07}O_{14}$ | 61% |
| $Ca_3Nb_{0.88}(Ga_{0.25}Gd_{0.75})_{3.17}Si_{2.23}O_{14}$ | 41% |
| $Ca_3Ta_{0.98}(Ga_{0.75}La_{0.25})_{3.02}Si_{2.07}O_{14}$ | 61% |
| $Ca_3Ta_{0.87}(Ga_{0.75}La_{0.25})_{3.17}Si_{2.24}O_{14}$ | 42% |
| $Ca_3Ta_{0.98}(Ga_{0.5}La_{0.5})_{3.02}Si_{2.07}O_{14}$ | 62% |
| $Ca_3Ta_{0.88}(Ga_{0.5}La_{0.5})_{3.16}Si_{2.24}O_{14}$ | 41% |
| $Ca_3Ta_{0.98}(Ga_{0.25}La_{0.75})_{3.02}Si_{2.07}O_{14}$ | 62% |
| $Ca_3Ta_{0.88}(Ga_{0.25}La_{0.75})_{3.16}Si_{2.22}O_{14}$ | 41% |
| $Ca_3Nb_{0.98}(Ga_{0.75}La_{0.25})_{3.02}Si_{2.07}O_{14}$ | 61% |
| $Ca_3Nb_{0.87}(Ga_{0.75}La_{0.25})_{3.18}Si_{2.24}O_{14}$ | 42% |
| $Ca_3Nb_{0.98}(Ga_{0.5}La_{0.5})_{3.02}Si_{2.07}O_{14}$ | 61% |
| $Ca_3Nb_{0.88}(Ga_{0.5}La_{0.5})_{3.16}Si_{2.21}O_{14}$ | 42% |
| $Ca_3Nb_{0.98}(Ga_{0.25}La_{0.75})_{3.02}Si_{2.07}O_{14}$ | 62% |
| $Ca_3Nb_{0.88}(Ga_{0.25}La_{0.75})_{3.17}Si_{2.23}O_{14}$ | 43% |

In the present invention, the composition of the raw material melt does not gradually change during crystal growth, and this helps decrease the cost of a piezoelectric crystal element by improving the yield. Furthermore, in melt growth which uses a starting raw material having a constant-ratio composition and has a crystallization ratio of 70% or more, an impurity inevitably forms inside the crystal. However, when using the langasite-based oxide having the congruent composition as starting raw material according to the present invention, it is possible to obtain a homogenous single crystal having a single composition and containing no impurity inside the crystal.

Note that the present invention is not limited to the embodiments explained above, and those skilled in the art can obviously carry out many modifications and combinations without departing from the technical scope of the invention. For example, Ca is exemplified as an alkaline-earth metal in the above description, but the present invention is not limited to this, and it is also possible to use, e.g., Sr or Ba.

The invention claimed is:

1. A crystal material manufacturing method comprising:
a first step of preparing a raw material mixture by mixing a carbonate or oxide of an alkaline-earth metal, an oxide of Nb or Ta or a mixture of an Nb oxide and a Ta oxide, an oxide of Ga, a carbonate or oxide of RE, and Si or an oxide thereof, so as to obtain each cation ratio indicated by any desired congruent composition of $AE_3ME_{1+a}(Ga_{1-x}RE_x)_{3+b}Si_{2+c}O_{14}$ (AE is an alkaline-earth metal, ME is Nb or Ta, RE is at least one of Y, Sc, and lanthanoide, $0 \le x \le 1$, $-0.5 < a < 0.5$, $-0.5 < b < 0.5$, and $-0.5 < c < 0.5$);
a second step of melting the raw material mixture; and
a third step of forming a crystal material made of a langasite-based oxide having the desired congruent composition by cooling the melted raw material mixture, and
wherein AE=Ca, ME=Ta, and RE=Sc, and $a \ne 0.0$, $b \ne 0.0$, and $c \ne 0.0$.

2. A crystal material comprising a langasite-structure oxide having any congruent composition of $AE_3ME_{1+a}(Ga_{1-x}RE_x)_{3+b}Si_{2+c}O_{14}$ (AE is an alkaline-earth metal, ME is Nb or Ta, RE is at least of one T, Sc, and lanthanoide, $0 \le x \le 1$, $-0.5 < a < 0.5$, $-0.5 < b < 0.5$, and $-0.5 < c < 0.5$) wherein AE=Ca, ME=Ta, and RE=Sc, and $a \ne 0.0$, $b \ne 0.0$, and $c \ne 0.0$.

* * * * *